United States Patent
Goins, III

[19]

[11] Patent Number: 5,931,311
[45] Date of Patent: *Aug. 3, 1999

[54] MODULE HANDLING APPARATUS AND METHOD WITH RAPID SWITCHOVER CAPABILITY

[75] Inventor: Fred Goins, III, Boise, Id.

[73] Assignee: MCMS, Inc., Nampa, Id.

[ * ] Notice: This patent is subject to a terminal disclaimer.

[21] Appl. No.: 08/891,954

[22] Filed: Jul. 14, 1997

Related U.S. Application Data

[63] Continuation of application No. 08/639,354, Apr. 26, 1996, Pat. No. 5,667,077.

[51] Int. Cl.⁶ .................................................. B07R 13/05
[52] U.S. Cl. .................. 209/573; 198/735.3; 198/836.4; 324/73.1
[58] Field of Search ..................................... 209/571–574; 198/735.3, 836.4; 324/73.1, 754, 762, 158.1

[56] References Cited

U.S. PATENT DOCUMENTS 5,266,912  11/1993  Kledzik .................................... 333/247

FOREIGN PATENT DOCUMENTS 2-38870  2/1990  Japan .

*Primary Examiner*—Boris Milef
*Attorney, Agent, or Firm*—Schwegman, Lundberg Woessner & Kluth P.A.

[57] ABSTRACT

An apparatus and method for the rapid switchover between different height modules in an automatic module testing and handling machine. The multi-chip module (MCM) handling apparatus comprises a bottom rail and a guide rail which has an upwardly extending wall and an outwardly extending flange which form a channel. This channel provides a passageway through which a MCM of a first thickness can pass laterally such that the first MCM is in contact with the top surface which positions contact nodes provided on the first MCM at a predetermined vertical position with respect to the top surface. This handling apparatus further comprises a removable justifying plate (RJP) which is removably attached within the first channel, thereby forming a second channel. This second channel provides a passage way through which a MCM of a second thickness, which is less than the first thickness of the first MCM, can pass laterally. Thus, the second MCM is in contact with the upper surface of the RJP, thereby positioning contact nodes provided on the second MCM at substantially the same predetermined position with respect to the top surface, as the first MCM.

14 Claims, 6 Drawing Sheets

MODULE HANDLING APPARATUS AND METHOD WITH RAPID SWITCHOVER CAPABILITY

This application is a continuation of U.S. patent application Ser. No. 08/639,354, filed Apr. 26, 1996, now U.S. Pat. No. 5,667,077.

FIELD OF THE INVENTION

The present invention relates to an apparatus and method for the testing and handling of electronic parts, and more specifically to a multi-chip module handling apparatus and method with rapid switchover capability.

BACKGROUND OF THE INVENTION

The present invention relates to the testing and handling of multi-chip modules. These modules usually consist of a printed circuit board (PCB) onto which integrated circuit chips have been applied, on one side or on both sides, e.g. a Single In-line Memory Module (SIMM), or a Dual In-line Memory Module (DIMM). These PCB modules also consist of multiple pin edge connectors by which the PCB module is connected to an electronic device, such as a computer motherboard, when the module is inserted into an appropriate receptacle.

The PCB module must be tested after fabrication, but prior to use, in order to ensure high quality electronic parts. Multiple chip module handlers have been developed to automatically input electronic modules into a testing device. The machine tests the modules, and then sorts them depending on programmed criteria. The machine can include a hopper or tray into which numerous modules to be tested are loaded. The machine then feeds one module at a time onto a conveyance assembly which then conveys the module to the testing device for testing via the multiple pin edge connector. After testing, the machine is programmed to direct the module onto a next station, which can be one of multiple sorting containers depending on the outcome of the test.

Depending on the machine model or options available, multiple chip module (MCM) handlers may be capable of handling both single-side and dual-sided PCB modules, as well as modules of different heights, i.e., board thickness or chip height variations. The height difference between different types of modules can often be significant. In the past, MCM handlers have accommodated the height difference between different types of modules by allowing the end user to modify the configuration of the conveyance assembly prior to testing a batch of modules. This switchover has been accomplished by the operator removing one or more parts of the conveyance assembly and replacing them with one or more other parts that are constructed specifically for the height of the desired module and reconfiguring all sensors, switches, and other associated components. The time involved in modifying the configuration of the MCM handler for a different height part can be significant. In particular, when changing from a dual-sided SIMM to a single-sided SIMM, the time requirement can be as much as 2 to 5 minutes per switchover. Over the course of a shift, these switchovers can accumulate into a considerable amount of downtime, which is a significant loss of productivity in an automated industry.

What is needed is an automatic testing and handling conveyance assembly which can accommodate different height electronic modules easily and efficiently. What is also needed is an apparatus and method for the rapid switchover between different height modules in an automatic module testing and handling conveyance assembly. What is further needed is an apparatus and method which allow for the quick and efficient reconfiguration of a conveyance assembly to accommodate either single-sided or double-sided multi-chip modules.

SUMMARY OF THE INVENTION

The present invention teaches an apparatus and method for the rapid switchover between different height modules in an automatic module testing and handling machine. The multi-chip module (MCM) handling apparatus comprises a bottom rail having a top surface, and a guide rail having a bottom surface in contact with the bottom rail top surface. The guide rail also has an upwardly extending wall and an outwardly extending flange which form a channel defined by the bottom rail top surface, the extending wall and the flange. This channel provides a passageway through which an MCM of a first thickness can pass laterally such that the first MCM is in contact with the top surface which positions contact nodes provided on the first MCM at a predetermined vertical position with respect to the top surface. This handling apparatus further comprises a removable justifying plate (RJP) having an upper surface and a lower surface, both substantially parallel to the bottom rail top surface. This RJP is removably attached in contact with the bottom rail top surface within the first channel, thereby forming a second channel defined by the upper surface, the extending wall and the flange. This second channel provides a passage way through which an MCM of a second thickness, which is less than the first thickness of the first MCM, can pass laterally. Thus, the second MCM is in contact with the upper surface of the RJP, thereby positioning contact nodes provided on the second MCM at substantially the same predetermined position with respect to the top surface, as the first MCM.

The present invention provides an automatic handling and testing conveyance assembly which can accommodate different height electronic modules easily and efficiently. It also provides a removable justifying plate which can be quickly and efficiently attached to an MCM conveyance assembly while the conveyance assembly is configured for a larger height module, in order to accommodate a smaller height module for handling and testing without having to disassemble the conveyance assembly. In addition, the present invention provides an apparatus and method which allow for the quick and efficient reconfiguration of a conveyance assembly to accommodate either single-sided or double-sided MCMs. Also provided is a removable justifying plate which meets the above requirements that is rugged, durable, electrically and statically compatible with the modules being handled, of relatively simple design and economical manufacture, and is relatively simple to install.

DETAILED DESCRIPTION

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1:
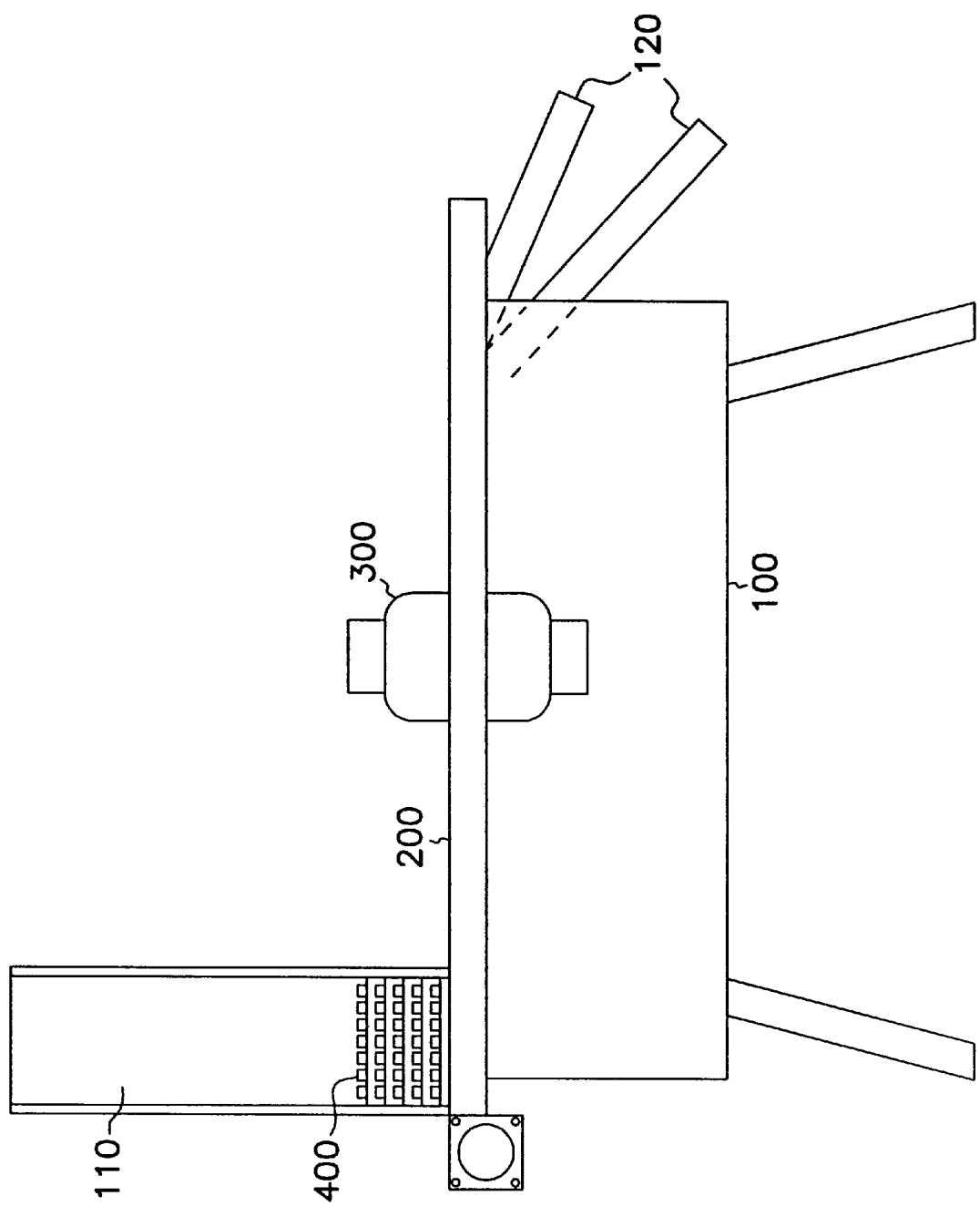
FIG. 1 is an overall depiction of an automatic multi-chip module (MCM) handling and testing machine showing the major components.

Referring now to the drawings, FIG. 1 illustrates an automatic multi-chip module handling and testing machine 100 which automatically inputs electronic modules into a testing device 300. Examples of this type of handling machine are the Model 828-MCM & 838-DIM SIMM/DIMM Module Handlers by MC Systems, Inc., as described in the *Model 828-MCM & 838-DIM SIMM/DIMM Module Handlers Technical Manual*, Part Number 200298, Copyright 1995, incorporated herein by reference. The machine 100 can include a hopper (or tray) 110 into which the numerous multi-chip modules 400 to be tested are loaded. The machine 100 then feeds one module 400 at a time onto a conveyance assembly 200 which then conveys the module to the testing device 300 for testing. After testing, the machine 100 is programmed to direct the module 400 into one of multiple sorting containers 120 depending on the outcome of the test.

Figure 2:
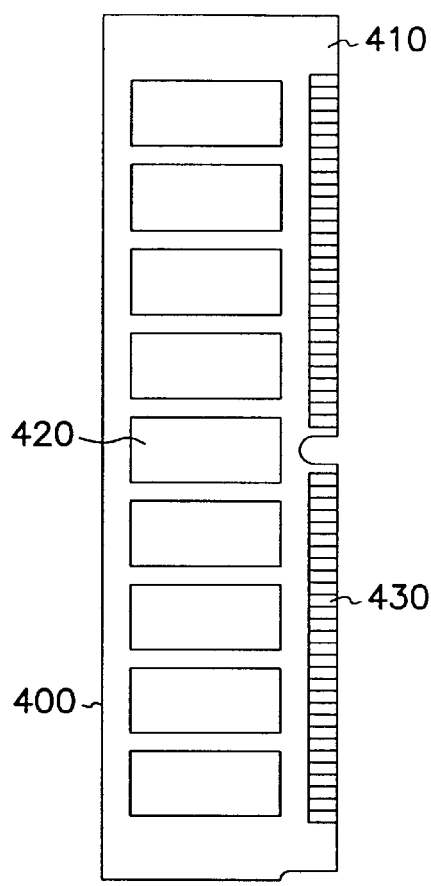
FIG. 2 is a top view of one type of MCM showing the printed circuit board, the chips and the edge connectors.
Figure 3:
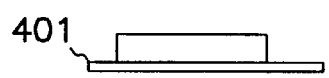
FIG. 3 is a side view of a single-sided MCM as shown in FIG. 2.
Figure 4:
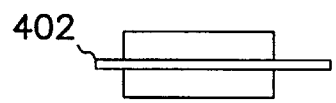
FIG. 4 is a side view of a double-sided MCM as shown in FIG. 2.

A multi-chip module (MCM) 400, as shown in FIGS. 2, 3, and 4, usually consists of a printed circuit board 410 onto which a plurality of integrated circuit chips 420 have been mounted. These chips 420 can be mounted on either one surface, known as a single-sided module 401, or on both surfaces, known as a double-sided module 402. Included on these modules are contact nodes, usually in the form of edge connectors 430 which have traces on both sides of the printed circuit board. These edge connectors 430 provide contact with an electronic device, such as a computer motherboard, when the module is plugged in to an appropriate receptacle connected to the device.

Various types of MCMs exist; for example, in-line memory modules. On a single in-line memory module, or SIMM, the module has a single pitch edge connector where the traces of the edge connectors 430 are plated through the printed circuit board 410 so that the same information is available on either side of the board. On a dual in-line memory module, or DIMM, the module has a dual pitch edge connector where the edge connector traces are isolated and not common to each side so that the information is different on either side of the board. Both SIMMs and DIMMs can be single-sided or double-sided. The present invention, although primarily designed to work with SIMMs or DIMMs, will accommodate any MCM which is designed similar to a SIMM or DIMM, as well as many others.

Figure 5:
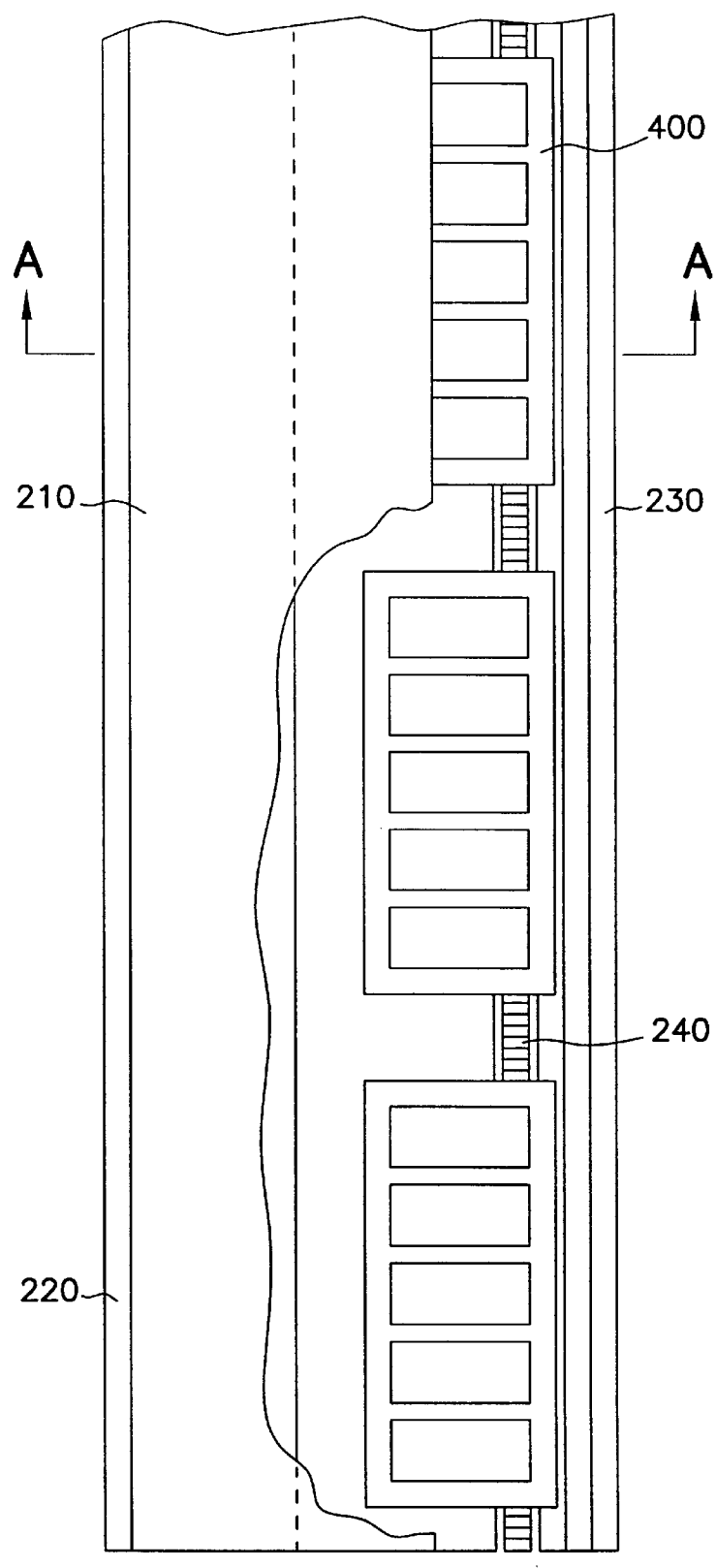
FIG. 5 is a top view of a conveyance assembly of an automatic module handling and testing machine, partially broken away, showing multiple MCMs being conveyed.
Figure 6:
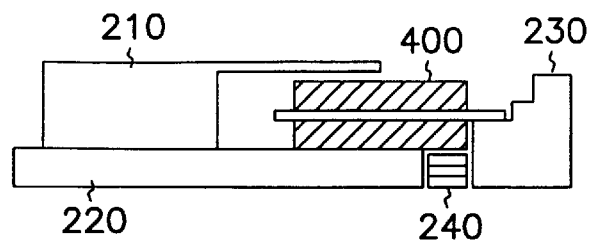
FIG. 6 is side sectional view of a conveyor assembly taken along line 6—6 of FIG. 5.

FIGS. 5 and 6 depict a section of the conveyance assembly used to transport MCMs 400 from the hopper 110 to the testing device 300. The MCM 400 is moved by a conveyor 240 along a path formed by an assembly of rails which support the MCM 400 during conveyance. The bottom rail 220 provides the base support for all types of modules. The guide rail 210 restricts the upward movement of the MCM 400 as it moves along the conveyance assembly 200. The side rail 230 provides support for the connector edge of the MCM 430 during transport.

Figure 7:
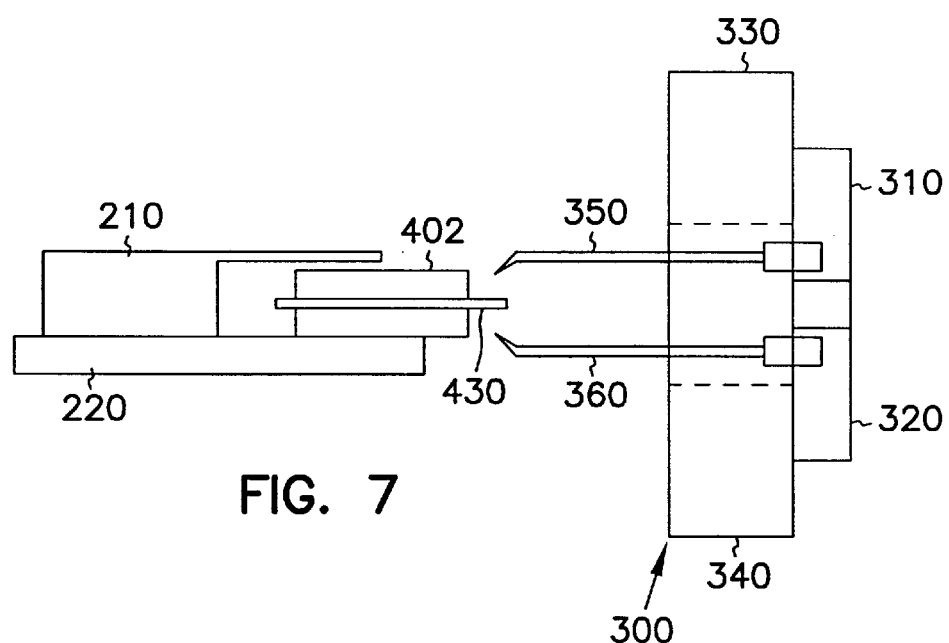
FIG. 7 is a side sectional view of a type of testing device used in conjunction with an automatic MCM handling and testing machine showing a module in position for testing and the contact pins used to contact the module edge connectors.

In FIG. 7, a double-sided MCM 402 is shown in position for testing by the testing device 300. The purpose of the testing device 300 is to make electrical contact with the edge connector traces 430 of the MCM. This is accomplished using upper and lower contactor pins 350, 360 which are mounted into upper and lower contactor assemblies 310, 320 attached to upper and lower mounting blocks 330, 340. These assemblies are programmed to raise and lower, as necessary, to make contact with the MCM 402 when it is in position and ready for testing. The guide rail 210 provides a restraint during testing to counteract the forces applied to the edge connectors 430 by the contact pins 350, 360. The testing device 300 is programmed to send and receive the appropriate signals that indicate the condition of the module under test. Once the test is performed, the testing device 300 sends a control signal to a sorting mechanism which shuttles the tested modules into the appropriate sorting containers 120 as shown in FIG. 1.

Figure 8:
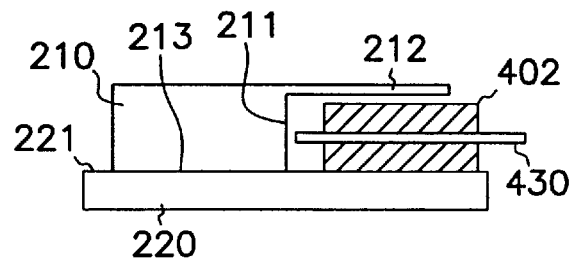
FIG. 8 is an end view of a handling apparatus as configured for double-sided MCMs in both the prior art and the present invention.

The present invention is specifically related to the conveyance of MCMs within the automatic MCM handling and testing machine. As previously described, the guide rail 210, shown in FIG. 8, provides both a pathway for and a restraint on the modules 402 being conveyed. The guide rail 210 can be constructed to accommodate any size or type of MCM, whether single-sided, double-sided, thicker/thinner printed circuit board, or thicker/thinner chips. The bottom rail 220 provides support for any type of MCM being handled and, when combined with the guide rail, forms a module handling assembly.

The bottom rail 220 has a top surface 221 on which many of the MCMs, such as the double-sided MCM 402 shown, are supported by direct contact. The guide rail 210 has a bottom surface 213 which is mounted in contact with the top surface of the bottom rail 221, an upwardly extending wall 211 which is substantially perpendicular to the top surface 221, and an outwardly extending flange 212 which overhangs the top surface 221. These two rails, the guide rail 210 and the bottom rail 220, form a channel defined by the top surface 221, the wall 211, and the flange 212, through which the modules 402 pass laterally. As the modules move along the conveyor through the defined channel of the module handling assembly, the edge connector of the module 430 is maintained at a predetermined vertical position above the top surface 221, in order to match up with the testing device contactor pins 350, 360 as shown in FIG. 7.

Figure 9:
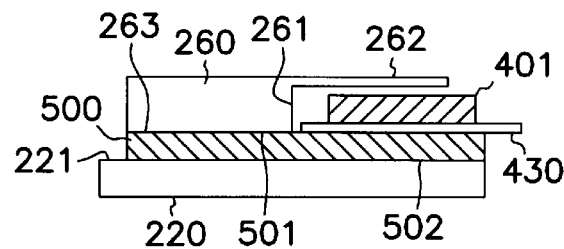
FIG. 9 is an end view of a handling apparatus as configured for single-sided MCMs in the prior art.

When the automatic handling machine is set up to run a batch of modules, the module handling assembly is configured by having an appropriate guide rail 210 chosen and mounted to the bottom rail 220 to form a channel of the necessary vertical height to accommodate the modules under test. Both in the past, and in the present invention, if a batch of double-sided modules is being tested, the module handling assembly is configured as shown in FIG. 8, as described above. However, in the past, to switch over to single-side modules it was necessary to disassemble the module handling assembly and reconfigure it as shown in FIG. 9. The bottom rail 220 remains the same, but a new single-sided guide rail 260 constructed for the single-side module 401 is used in conjunction with a spacer plate 500 such that the spacer plate is mounted with its bottom surface 502 in contact with the top surface of the bottom rail 221. The bottom surface of the single-sided guide rail 263 then mounts in contact with the spacer plate top surface 501. The single-sided guide rail 260 has an upwardly extending wall 261, similar to the wall 211 shown in FIG. 8, except that the vertical height of the wall 261 is shortened by the amount equal to the thickness of the spacer 500. The single-sided guide rail 260 also has an outwardly extending flange 262 which over hangs the top surface of the spacer 501 such that a channel if formed defined by the top surface of the spacer 501, the wall 261 and the flange 262 through which single-sided modules 401 pass laterally. As the single-sided modules 401 move along the conveyor through the defined channel of the module handling assembly, the edge connector of the module 430 is still maintained at the same predetermined vertical position above the top surface of the bottom rail 221, in order to match up with the testing device contactor pins 350, 360 as shown in FIG. 7.

The thickness of the spacer 500 is based on the thickness of the lower chip on the double-sided module 402 in FIG. 8 such that the printed circuit board, edge connector and upper chip of the single-sided module 401 are at substantially the same vertical position above the top surface of the bottom rail 221 as the equivalent module components on the double-sided module 402. Once the batch of single-sided modules has been tested and another batch of double-sided modules is ready for testing, the above described module handling assembly of FIG. 9 must be disassembled and reconfigured as shown in FIG. 8. This switchover process must be repeated as many times a day as required to meet the testing needs of the modules requiring testing. In addition to the components of the module handling assembly, other machine components such as sensors and switches must also be readjusted or realigned each time the disassembly and switchover process takes place. The problem with this method of switching over from double-sided to single-sided, and back again, is the time requirement and inefficiency of the disassembly process, as described above.

Figure 10:
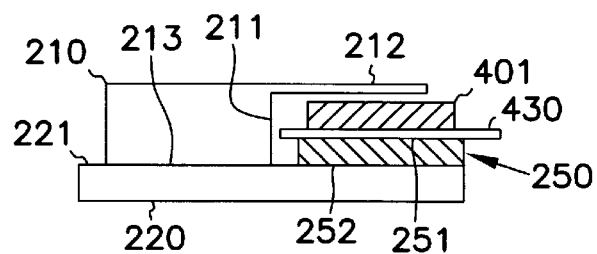
FIG. 10 is an end view of a handling apparatus as configured for single-sided MCMs in the present invention.

The present invention teaches an apparatus and a method for making these switchovers quickly and efficiently because no disassembly and no readjustment are required. In FIG. 10, the module handling assembly of the present invention is configured for single-sided modules 401 such that the guide rail 210 for a double-sided module remains mounted in contact with the top surface of the bottom rail 221. In order to support the single-sided module 401 such that the edge connector of the module 430 is still maintained at the same predetermined position as those of the double-sided modules 402, a removable justifying plate 250 is mounted in contact with the top surface of the bottom rail 221. Instead of disassembling the module handling assembly, and replacing the guide rail 210 with the single-sided guide rail 260 and spacer plate 500, the removable justifying plate 250 is just added to the double-sided configuration.

The removable justifying plate 250 is mounted with its lower surface 252 in contact with the top surface of the bottom rail 221, and its upper surface 251 becomes part of the channel through which the single-sided modules 401 are passed laterally. This channel is now defined by the upper surface of the removable justifying plate 251, the wall of the guide rail 211, and the flange of the guide rail 212. Thus, the single-sided modules are supported by the removable justifying plate 250 such that the edge connector of the module 430 is still maintained at the same predetermined vertical position above the top surface of the bottom rail 221, in order to match up with the testing device contactor pins 350, 360 as shown in FIG. 7.

Figure 11:
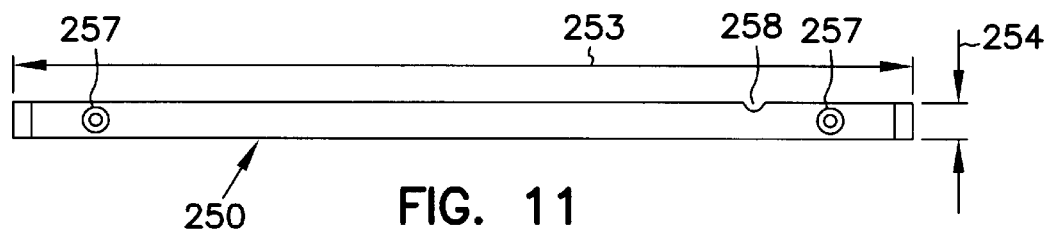
FIG. 11 is a dimensional top view of the preferred embodiment of the removable justifying plate.
Figure 12:
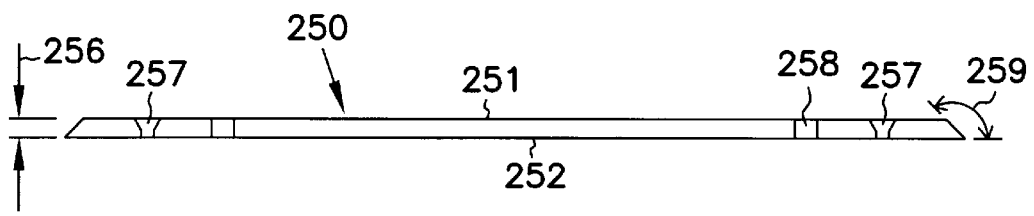
FIG. 12 is a dimensional side view of the preferred embodiment of the removable justifying plate, as shown in FIG. 11.

In the preferred embodiment shown in FIGS. 11 and 12, the removable justifying plate 250 is an elongate strip of substantially rigid material with the upper surface 251 relatively planar and parallel to the lower surface 252. The preferred length 253 of the plate is 18.000 inches and width 254 is 0.400 inches. The preferred method of attachment is using two threaded fasteners 255 such that the plate 250 includes two standard countersunk clearance holes 257 for a #6-32 screw thread, preferably located lengthwise 1.500 inches from end, 15.000 inches apart center-to-center, and widthwise on the centerline. FIGS. 11 and 12 show examples of edge notching 258 and end chamfers 259. These are representative of the various types of edge configurations that could be made to accommodate plate installation into an existing machine; they are not meant to limit the scope of the invention in anyway.

It is believed that the removable justifying plate should be fabricated from an electrostatic discharge (ESD) safe material. However, any material which meets the functional requirements of the present invention, and does not damage the multi-chip modules being tested, would be suitable for the intended purpose of the invention.

The upper surface 251 of the removable justifying plate 250, as shown in FIGS. 10, 11, and 12, must be substantially flat once installed in the module handling assembly. As its purpose is to provide a smooth, supportive passageway for the MCMs 401 during conveyance, the plate must not obstruct or hinder the movement of the modules. Therefore, it is necessary that any attachment method chosen must adhere to this requirement of unobstructed conveyance.

Figure 13:
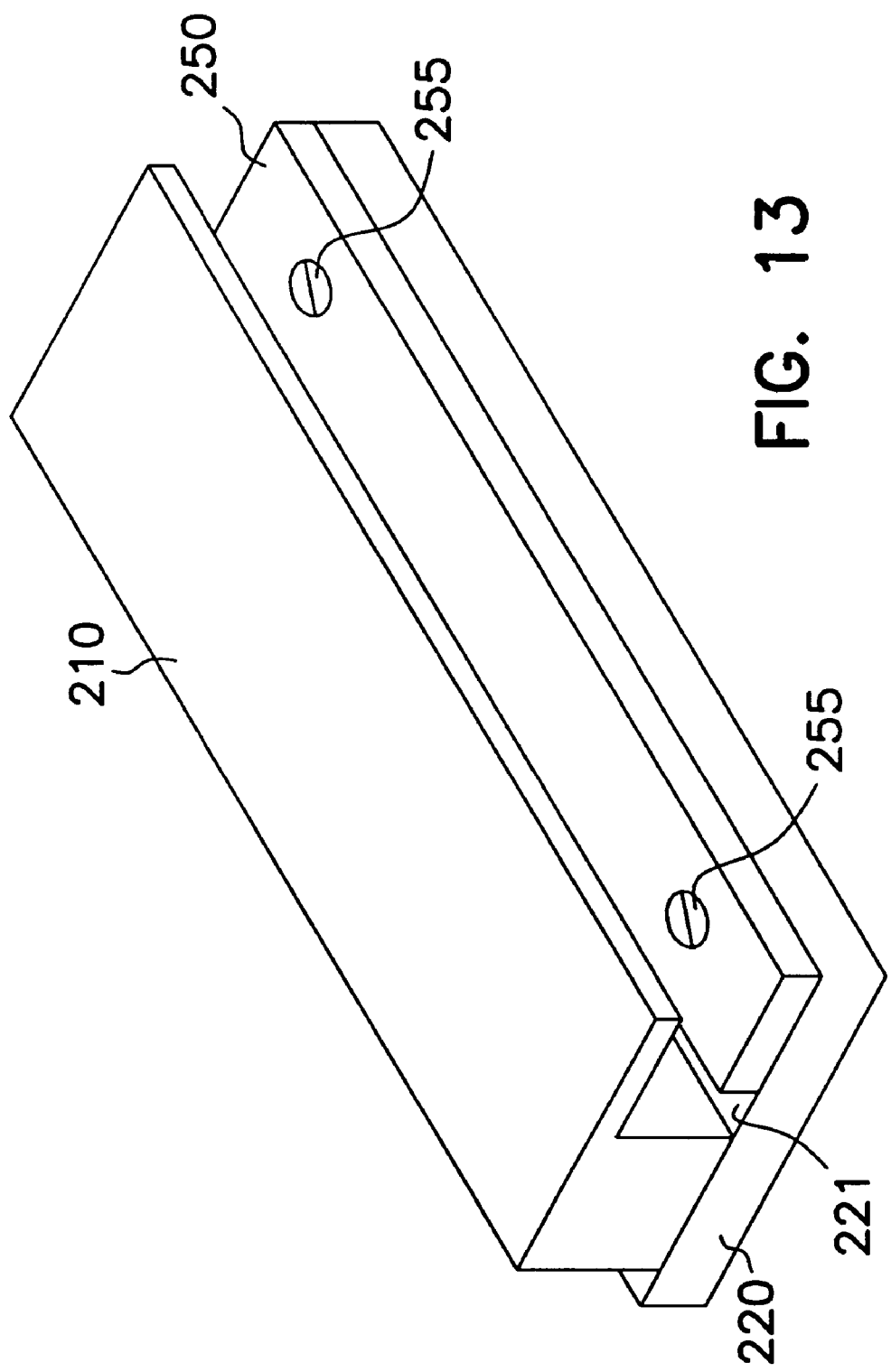
FIG. 13 is a perspective view of one embodiment of a handling apparatus configured for single-sided MCMs where the removable justifying plate is attached by a plurality of threaded fasteners.

As described above, in the preferred embodiment of the present invention, the removable justifying plate 250 is mounted to the top surface 221 by two threaded fasteners 255 along the length of the plate, as shown in FIG. 13. These threaded fasteners 255 are counter-sunk into the removable justifying plate 250 from the top and screw into a tapped hole in the bottom rail 220. Attachment of the removable justifying plate to the module handling assembly can be achieved in many other ways, in addition to that described in the preferred embodiment. These methods include, but are not limited to, use of a spring clip to attach to the guide rail flange 212, use of a spring clip to attach over the edge of the bottom rail 220, use of spring clips to attach into slots in the top surface of the bottom rail 221, use of threaded fasteners from the bottom so that the removable justifying plate has holes tapped from the lower surface 252, and use of a hook and loop type fastener where the loop portion resides in a recess in the top surface of the bottom rail 251. The requisite characteristics of any attachment method are that: 1) the locations of any fasteners must be determined based on whether the fasteners can be removed or installed in a minimum amount of time, without having to remove, disassemble, or reconfigure any other aspect of the automatic module handling machine; 2) any fasteners or attachment method must be compatible with the structure and function of the existing machine; 3) any modifications to the existing machine to accommodate the attachment method must be compatible with the machine's function and the intended use of the present invention; and 4) the chosen attachment method must be compatible with the structure of the removable justifying plate being used.

As shown in FIG. 12, the other critical dimension of the removable justifying plate 250 is the thickness of the plate 256. In the preferred embodiment, this thickness is 0.130 inches. This thickness is based on the height of the chips mounted on the bottom side of the printed circuit board in an MCM, as shown in FIGS. 8 & 10, such that the substitution of the removable justifying plate for these chips, when conveying a single-sided board, places the edge connectors 430 at substantially the same vertical position above the top surface of the bottom rail 221. The thickness of the plate will vary depending on the type of multi-chip modules being tested, and the variation in height between the different batches of modules for which the module handling machine must be reconfigured during a work shift.

Although the preferred embodiment and the figures teach of the present invention being used in conjunction with a change over from double-sided MCMs to single-sided MCMs, and back again, the present invention is not intended to be limited only to these types of changes. The present invention is equally applicable to any situation where a larger height module is being switched with a smaller height module. The controlling factor is the difference in height between the maximum height module to be handled and tested, and the module currently being tested. Once the range of modules to be tested has been determined for a particular shift/day, the guide rail 210, as shown in FIG. 8, is mounted to the bottom rail 220 on the automatic module handling machine. The remaining portions of the machine are then configured to handle these largest modules. Once the machine is fully configured for the maximum height modules, the smaller height modules can all be accommodated by the installation of an appropriate removable justifying plate 250, as shown in FIG. 10, whose thickness has been determined such that the smaller module's edge connectors remain at the same vertical position above the bottom rail as those of the maximum height module. Hence, the present invention is applicable to a wide range of multi-chip modules that require handling and testing in an automatic module handling and testing machine.

As can be seen from the above description, the advantages of the present invention include providing an automatic handling and testing conveyance assembly which can accommodate different height electronic modules easily and efficiently, providing a removable justifying plate which can be quickly and efficiently attached to an MCM conveyance assembly while the conveyance assembly is configured for a larger height module, in order to accommodate a smaller height module for handling and testing without having to disassemble the conveyance assembly, and providing an apparatus and method which allows for the quick and efficient reconfiguration of a conveyance assembly to accommodate either single-sided or double-sided MCMs. These advantages also include providing a removable justifying plate to meet the above requirements that is rugged, durable, electrically and statically compatible with the modules being handled, of relatively simple design and economical manufacture, and is relatively simple to install.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An apparatus for handling assembled multiple chip modules (MCMs) comprising:
   a bottom rail having a top surface;
   a guide rail having a bottom surface in contact with the bottom rail top surface, an upwardly extending wall, and an outwardly extending flange which forms a first channel defined in part by the bottom rail top surface; and
   a justifying plate having an upper surface and a lower surface, the justifying plate removably coupled with the bottom rail top surface within the first channel.

2. The apparatus as described in claim 1, wherein the justifying plate has at least one clearance hole therein, wherein said hole is for coupling the justifying plate with the bottom rail top surface.

3. The apparatus as described in claim 2, wherein the justifying plate is removably coupled with the bottom rail top surface with a threaded fastener disposed within each clearance hole.

4. The apparatus as described in claim 2, wherein each clearance hole is countersunk.

5. The apparatus as described in claim 1, wherein the justifying plate comprises an elongate strip of substantially rigid material, the elongate strip having an upper surface and a lower surface, wherein the upper surface is relatively planar and parallel to the lower surface.

6. An apparatus for handling assembled multiple chip modules (MCMs) comprising:
   a bottom rail having a top surface;
   a guide rail having a bottom surface in contact with the bottom rail top surface, an upwardly extending wall, and an outwardly extending flange which forms a first channel defined in part by the bottom rail top surface; and
   a removable justifying plate having an upper surface and a lower surface, the justifying plate removably coupled with the bottom rail top surface within the first channel; and
   means for coupling the removable justifying plate with the bottom rail top surface.

7. A handling and testing system for multiple chip modules (MCMS) comprising:
   a machine which handles MCMs;
   a testing device; and
   a conveyance assembly which transports MCMs from the machine to the testing device,
   wherein the conveyance assembly further comprises:
      a conveyor which provides movement of the MCMs,
      a side rail which provides support to a free edge of the MCMs,
      a bottom rail having a top surface;
      a guide rail having a bottom surface in contact with the bottom rail top surface, an upwardly extending wall, and an outwardly extending flange which forms a first channel defined in part by the bottom rail top surface; and
      a removable justifying plate having an upper surface and a lower surface, the justifying plate removably coupled with the bottom rail top surface within the first channel.

8. The handling and testing system as recited in claim 7, wherein the testing device has contactor pins for electrically contacting with contact nodes on a MCM, thereby testing predetermined electrical components on the MCM.

9. The handling and testing system described in claim 7, wherein the machine feeds one MCM at a time onto the conveyance assembly.

10. The handling and testing system described in claim 7, wherein the machine includes a tray into which MCMs are loaded.

11. A method for testing a plurality of multiple chip modules (MCMs) having multiple thicknesses in a handling and testing apparatus, the method comprising:

setting up the handling apparatus for a first set of MCMs of a first thickness;

loading the first set of MCMs of a first thickness into a channel of the handling apparatus;

conveying each MCM of the first set of MCMs singularly to a testing device;

testing each MCM of the first set of MCMs;

setting up the handling apparatus for a second set of MCMs of a second thickness, including:

coupling a removable justifying plate only within the channel of the handling apparatus such that a second set of MCMs having a second thickness conveyed therethrough are maintained at substantially the same vertical position with respect to the channel;

loading a second set of MCMs of a second thickness into the handling apparatus;

conveying each MCM of the second set of MCMs singularly to the testing device; and testing each MCM of the second set of MCMs.

12. The method for testing as recited in claim 11, wherein testing each MCM includes contacting contactor pins with edge connector traces of each MCM.

13. The method for testing as recited in claim 11, wherein coupling the justifying plate includes inserting threaded fasteners through clearance holes of the justifying plate.

14. The method for testing as recited in claim wherein conveying the first and second set of MCMs includes singularly feeding the MCMs from a hopper to a conveyance assembly.

* * * * *

UNITED STATES PATENT AND TRADEMARK OFFICE
CERTIFICATE OF CORRECTION

PATENT NO.: 5,931,311

DATED: Aug. 3, 1999

INVENTOR(S): Goins, III

It is certified that error appears in the above-identified patent and that said Letters Patent is hereby corrected as shown below:

In column 10, line 18, insert -- 11-- after "claim", therefor.

Signed and Sealed this

Fifteenth Day of August, 2000

Attest:

Q. TODD DICKINSON

Attesting Officer

Director of Patents and Trademarks